United States Patent
Vandentop et al.

(10) Patent No.: US 7,330,357 B2
(45) Date of Patent: Feb. 12, 2008

(54) INTEGRATED CIRCUIT DIE/PACKAGE INTERCONNECT

(75) Inventors: Gilroy J. Vandentop, Tempe, AZ (US); Hamid R. Azimi, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 508 days.

(21) Appl. No.: 10/667,694

(22) Filed: Sep. 22, 2003

(65) Prior Publication Data

US 2005/0063164 A1    Mar. 24, 2005

(51) Int. Cl.
*H05K 7/10* (2006.01)
*H05K 7/12* (2006.01)

(52) U.S. Cl. .................. 361/769; 361/770; 361/794
(58) Field of Classification Search ........ 361/760–764, 361/770–774, 803; 174/259–262; 257/700–704, 257/723–724, 778–780
See application file for complete search history.

(56) References Cited

U.S. PATENT DOCUMENTS

| | | | | |
|---|---|---|---|---|
| 5,454,161 A | * | 10/1995 | Beilin et al. | 29/852 |
| 5,813,115 A | * | 9/1998 | Misawa et al. | 29/832 |
| 6,084,781 A | * | 7/2000 | Klein | 361/771 |
| 6,303,408 B1 | * | 10/2001 | Smith | 438/106 |
| 6,469,494 B1 | * | 10/2002 | Cuevas | 324/158.1 |
| 6,573,609 B2 | * | 6/2003 | Fjelstad et al. | 257/778 |

* cited by examiner

*Primary Examiner*—Tuan T. Dinh
(74) *Attorney, Agent, or Firm*—Buckley, Maschoff & Talwalkar LLC

(57) ABSTRACT

A system may include a plurality of pliant conductive elements, a first end of one of the plurality of pliant conductive elements to be electrically coupled to a first electrical contact of an integrated circuit substrate and a second end of the one of the plurality of pliant conductive elements to be electrically coupled to a second electrical contact of an integrated circuit die.

4 Claims, 21 Drawing Sheets

INTEGRATED CIRCUIT DIE/PACKAGE INTERCONNECT

BACKGROUND

An integrated circuit (IC) die may include electrical devices that are integrated with a semiconductor substrate. The IC die may also include conductive paths that electrically couple the electrical devices to one another and to external connections. The die may include several layers of conductive paths, with each layer separated from adjacent layers by an inter-layer dielectric (ILD). The ILD may comprise a material having an extremely low dielectric constant (k) in order to minimize capacitance coupling and crosstalk between the conductive paths.

Low-k ILD materials often exhibit a coefficient of thermal expansion (CTE) that differs significantly from other elements to which they are coupled, such as the other elements of an IC die and an IC package. Moreover, these materials are often brittle. Many low-k ILD materials are prone to cracking during IC die fabrication and/or operation due to these characteristics.

DETAILED DESCRIPTION

Figure 1:
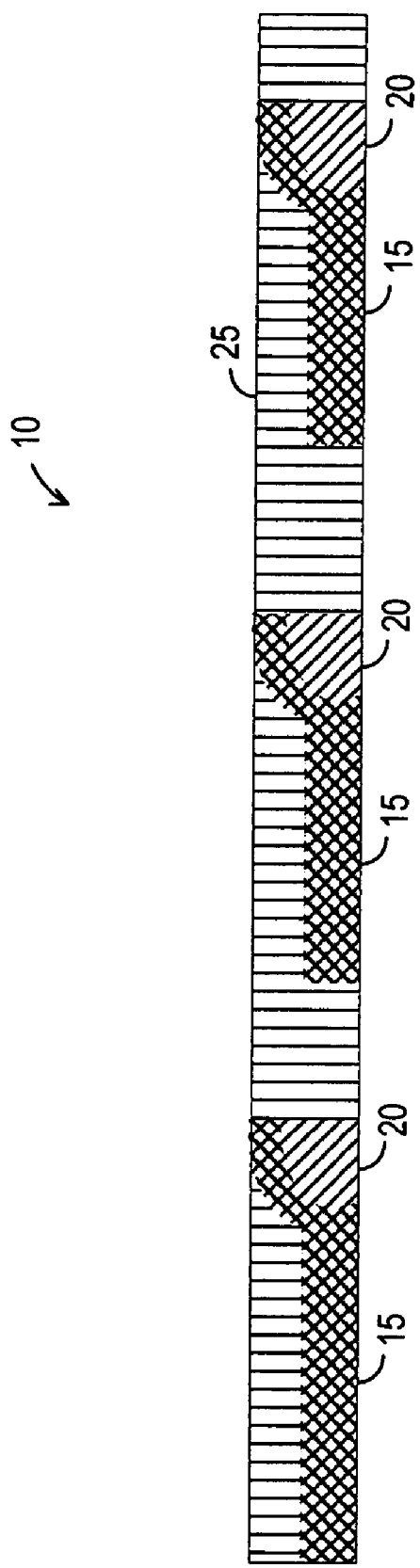
FIG. 1 is a cutaway side view of an apparatus according to some embodiments.

FIG. 1 is a cutaway side view of apparatus 10. According to some embodiments, apparatus 10 may be bonded to an IC substrate and to an IC die to provide electrical interconnections and to absorb mechanical stress therebetween. Apparatus 10 includes a plurality of pliant conductive elements 15, first pliant material 20 and second pliant material 25.

Conductive elements 15 may comprise any suitable currently- or hereafter-known conductor, including but not limited to copper. The composition and/or shape of at least one of conductive elements 15 may differ from another one or more of conductive elements 15. One or more of conductive elements 15 may include a first electrical contact located at a lower surface of apparatus 10 and a second electrical contact located at an upper surface of apparatus 10.

First pliant material 20 may comprise any pliant material, including a dielectric material. Second pliant material 25 may also include any pliant material. First pliant material 20 and second pliant material 25 may differ in material, density, and/or dielectric value. In some embodiments, first pliant material 20 and second pliant material 25 are identical.

Figure 2B:
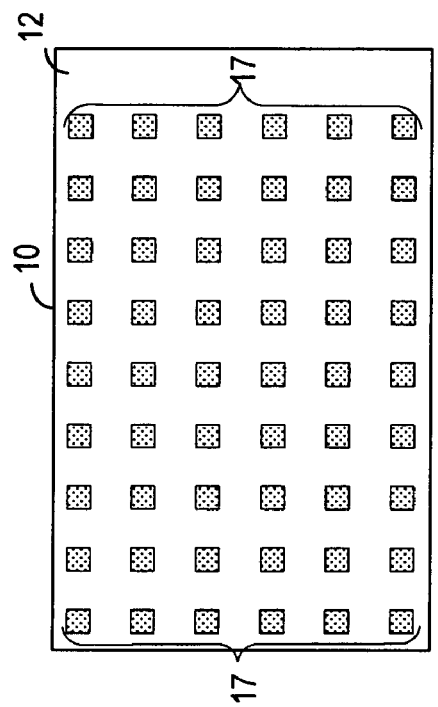
FIG. 2A is a top view and FIG. 2B is a bottom view of an apparatus according to some embodiments.
Figure 2A:
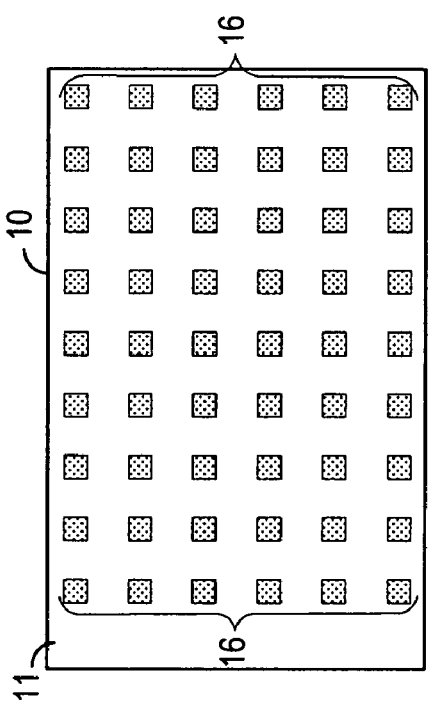

FIG. 2A is a top view of apparatus 10 according to some embodiments. Upper surface 11 of apparatus 10 includes electrical contacts 16. Electrical contacts 16 may comprise ends of respective ones of conductive elements 15 and may be gold and/or nickel-plated. In some embodiments, electrical contacts 16 may be coated with a thin layer of solder prior to being bonded to corresponding electrical contacts of an IC die.

Lower surface 12 of apparatus 10 according to some embodiments is shown in FIG. 2A. Lower surface 12 includes electrical contacts 17, which also may comprise ends of respective ones of conductive elements 15 and may be gold and/or nickel-plated. Electrical contacts 16 may be coated with a thin layer of solder prior to being bonded to corresponding electrical contacts of an IC substrate.

Figure 3:
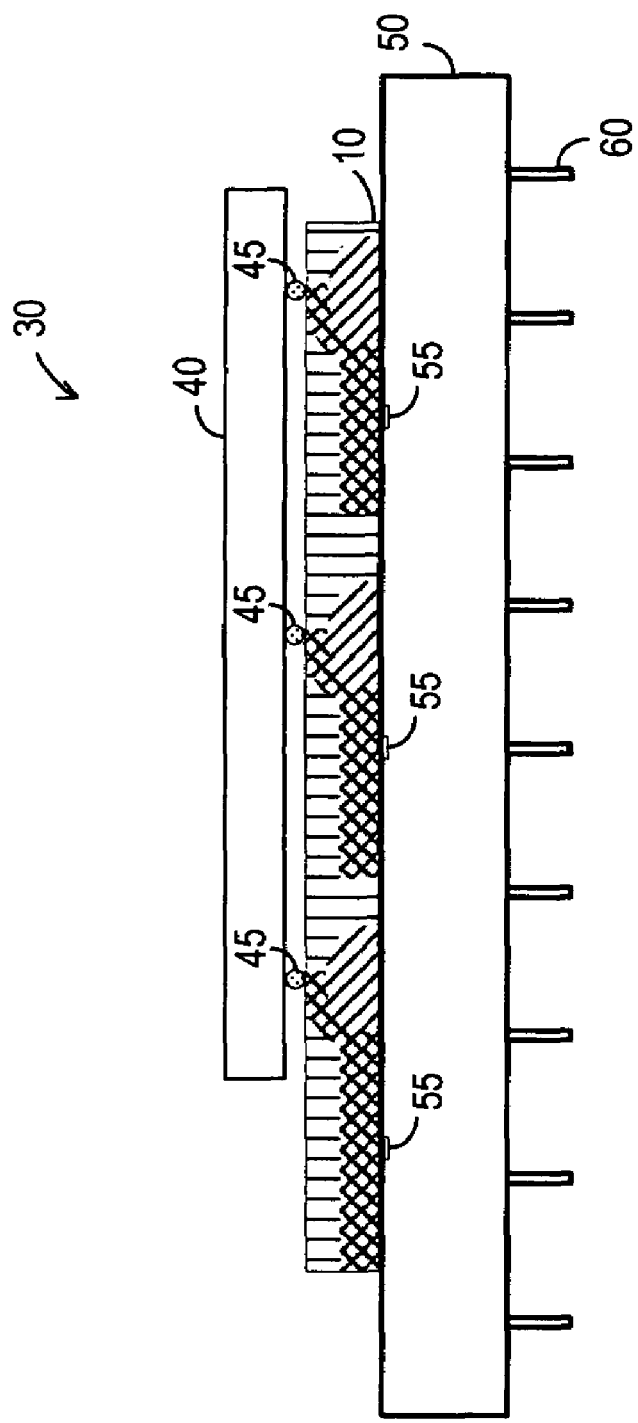
FIG. 3 is a cutaway side view of an IC substrate, an IC die, and an apparatus according to some embodiments.

FIG. 3 is a cutaway side view of device 30 according to some embodiments. Device 30 includes IC die 40, apparatus 10, and IC substrate 50. Apparatus 10 may provide, in some embodiments, electrical interconnection and/or absorption of mechanical stress between IC die 40 and IC substrate 50.

IC die 40 includes integrated electrical devices and may be fabricated using any suitable material and fabrication techniques. IC die 40 may provide one or more functions. In some embodiments, IC die 40 comprises a microprocessor chip having a silicon substrate. Electrical contacts 45 are coupled to IC die 40 and may comprise Controlled Collapse Chip Connect (C4) solder bumps. Electrical contacts 45 may be bonded to respective ones of electrical contacts 16 of apparatus 10.

Electrical contacts 45 may also be electrically coupled to the electrical devices that are integrated into IC die 40. The electrical devices may reside between a substrate of IC die 40 and electrical contacts 45 in a "flip-chip" arrangement. In some embodiments, such a substrate resides between the electrical devices and electrical contacts 45.

Substrate 50 may comprise an IC package, a circuit board, or other substrate. Substrate 50 may therefore comprise any ceramic, organic, and/or other suitable material. Substrate 50 includes electrical contacts 55 which may also comprise any suitable contact configuration and material. Electrical contacts 55 may be bonded to respective ones of electrical contacts 17 of apparatus 10. Apparatus 10 may thereby carry power and/or I/O signals between IC die 40 and IC substrate 50.

Substrate 50 also comprises through-hole pins 60 that are electrically coupled to electrical contacts 55. Accordingly, pins 60 may carry power and I/O signals between elements of device 30 and external devices. For example, pins 60 may be mounted directly to a motherboard (not shown) or onto a socket that is in turn mounted directly to a motherboard. Alternative interconnects such as solder balls may be used instead of pins 60 to mount device 30 to a motherboard or other substrate.

Figure 4:
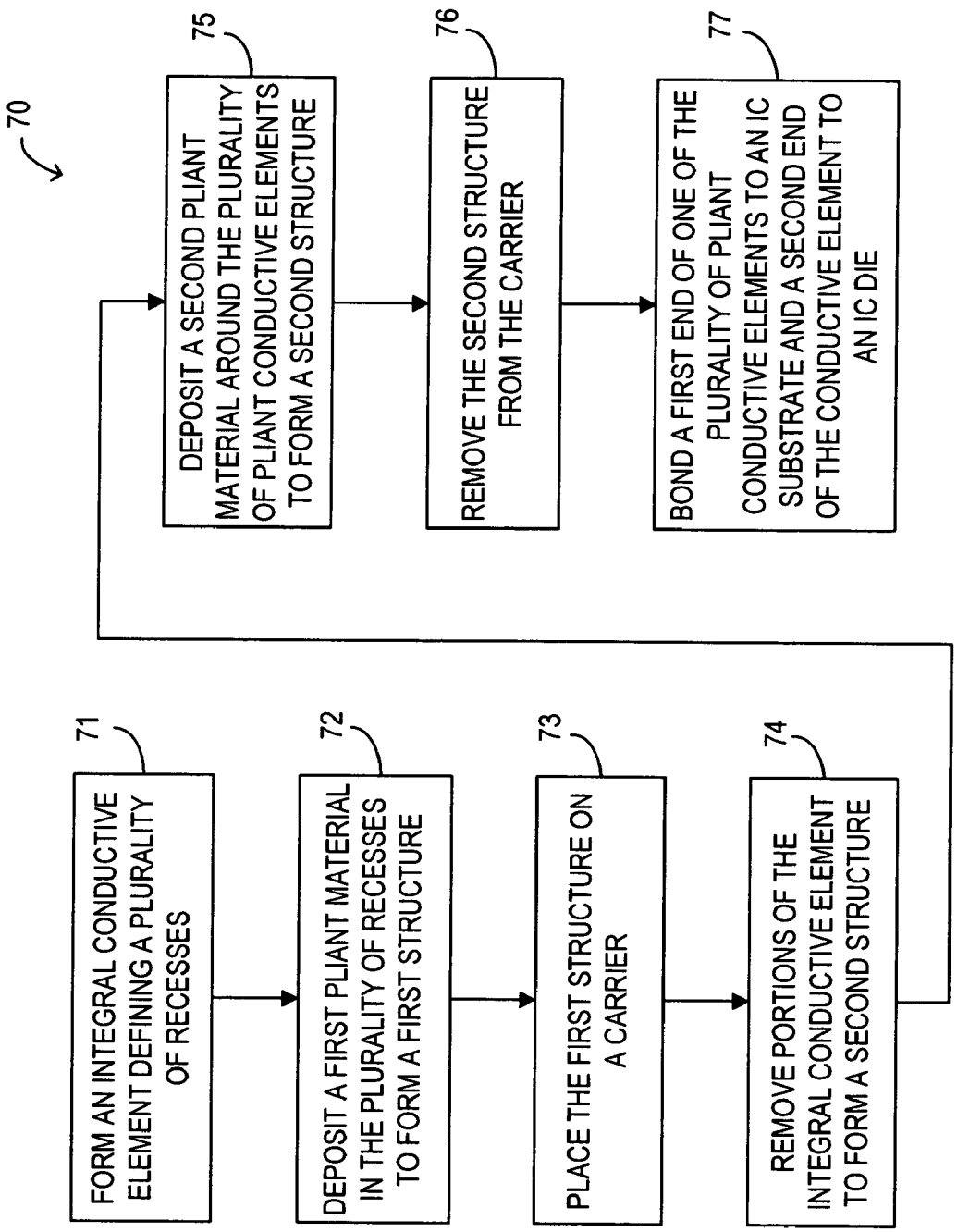
FIG. 4 is a diagram of a process to fabricate the FIG. 3 device according to some embodiments.

FIG. 4 is a diagram of process 70 according to some embodiments. Process 70 may be executed by one or more fabrication devices, and all or a part of process 70 may be executed manually. Process 70 may be executed by an entity different from an entity that manufactures IC die 40 and/or IC substrate 50.

Figure 5:
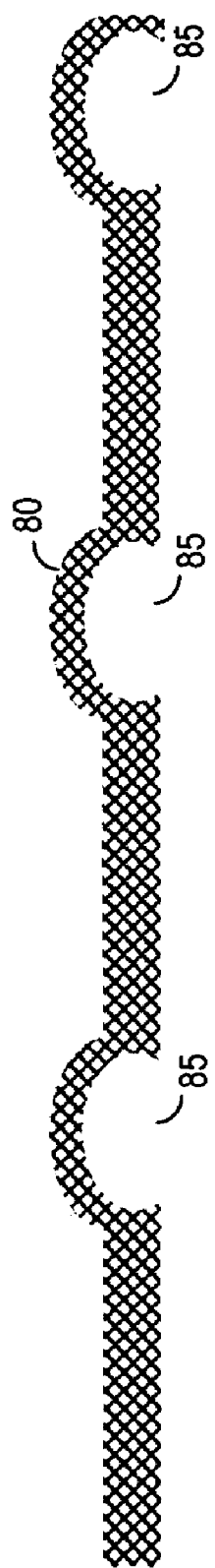
FIG. 5 is a side view of an integral conductive element according to some embodiments.

Initially, at 71, an integral conductive element is formed having a plurality of recesses. FIG. 5 shows integral conductive element 80 according to some embodiments. Element 80 defines recesses 85, the functions of which will be described below. Integral conductive element 80 may consist of any suitable material and may be formed in any manner according to some embodiments. In one example, element 80 is composed of copper and is press-formed onto a mold.

Figure 6:
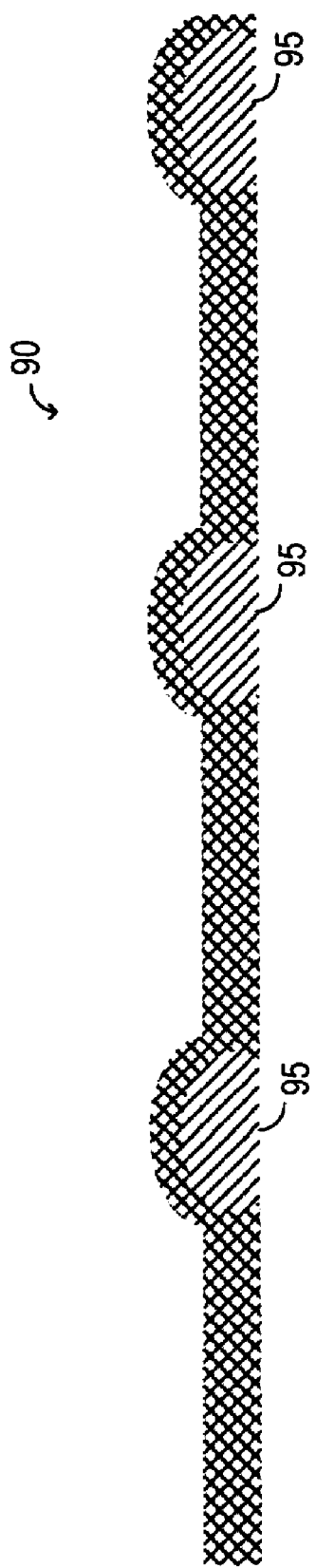
FIG. 6 is a side view of an integral conductive element in combination with pliant material according to some embodiments.

A first pliant material is deposited in recesses 85 at 72. FIG. 6 illustrates first structure 90 that is formed by the deposition of first pliant material 95. The first pliant material may comprise any suitable pliant material, and may possess dielectric characteristics. In some embodiments of 72, first pliant material 95 is cast and cured within recesses 85.

Figure 7:
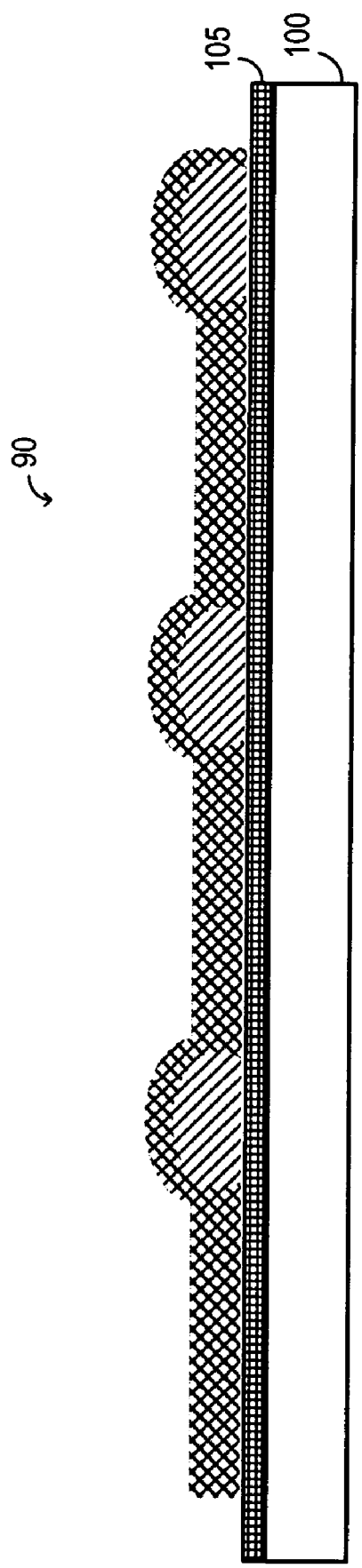
FIG. 7 is a side view of an integral conductive element, pliant material, and a carrier according to some embodiments.

FIG. 7 shows first structure 90 after being placed on carrier 100 at 73. Carrier 100 may comprise a work surface such as a glass or metal wafer chuck. Carrier 100 is coated in some embodiments with release layer 105. Release layer 105 may assist in securing first structure 90 to carrier 100. Next, at 74, portions of integral conductive element 80 are removed. Any currently- or hereafter-known method may be used to remove the portions.

Figure 8:
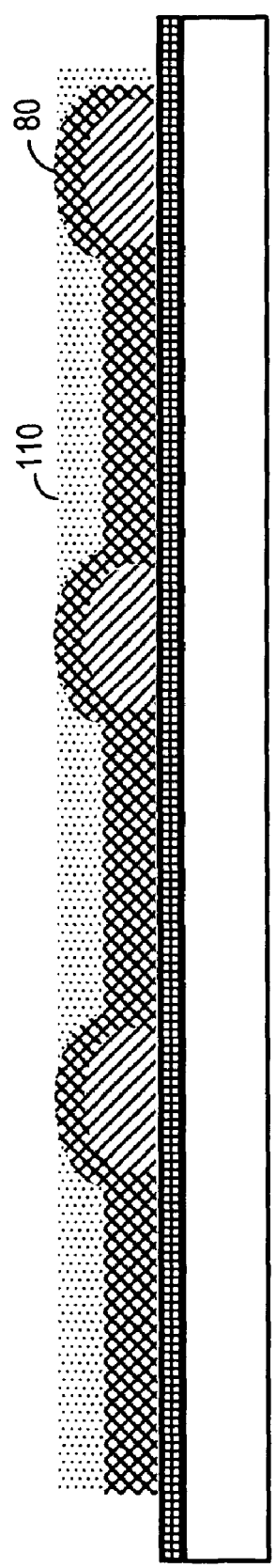
FIG. 8 is a side view of an integral conductive element, pliant material, a carrier, and photoresist according to some embodiments.
Figure 9:
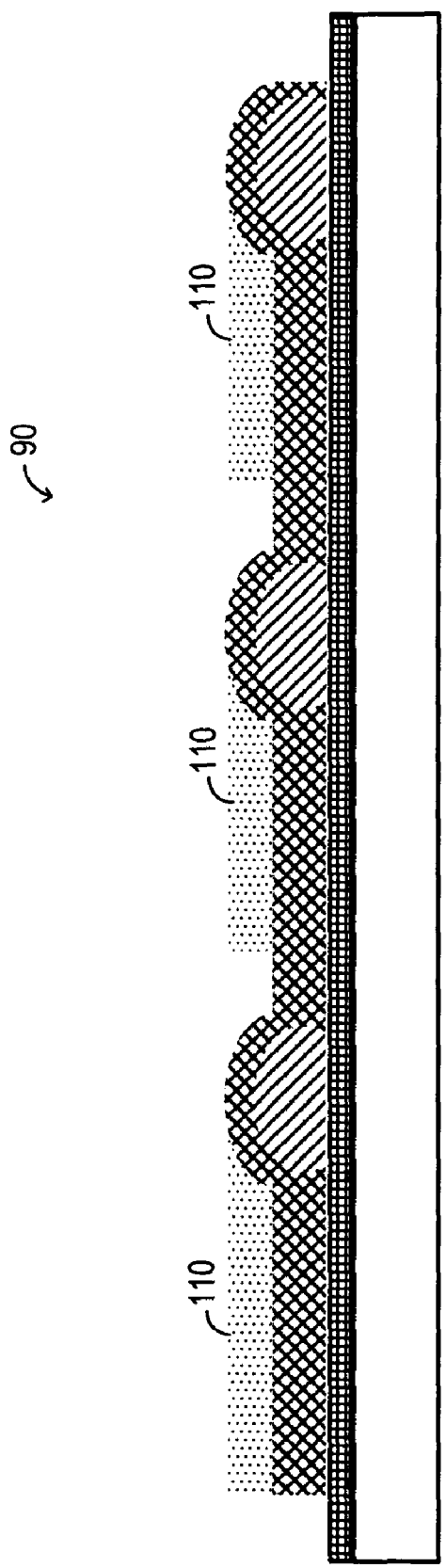
FIG. 9 is a side view of an integral conductive element, pliant material, a carrier, and photoresist according to some embodiments.

According to some embodiments, and as illustrated in FIG. 8, photoresist 110 is initially deposited on first structure 90 at 74. Photoresist 110 is then selectively removed using any suitable technique such as masking, UV exposure and stripping. A resulting structure is illustrated in FIG. 9. First structure 90 is then etched to remove elements that are not protected by photoresist 110, and remaining portions of photoresist 110 are removed.

Figure 10:
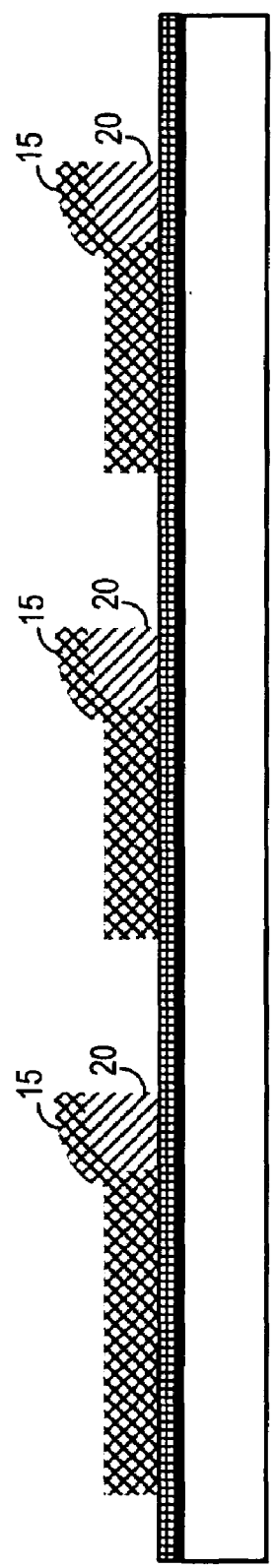
FIG. 10 is a side view of a plurality of pliant conductive elements, pliant material, and a carrier according to some embodiments.

FIG. 10 illustrates compliant conductive elements 15 that are formed by the removal of the portions from integral conductive element 80. As shown, elements of first pliant material 95 have also been removed to form first pliant material 20 of FIG. 1.

Figure 11:
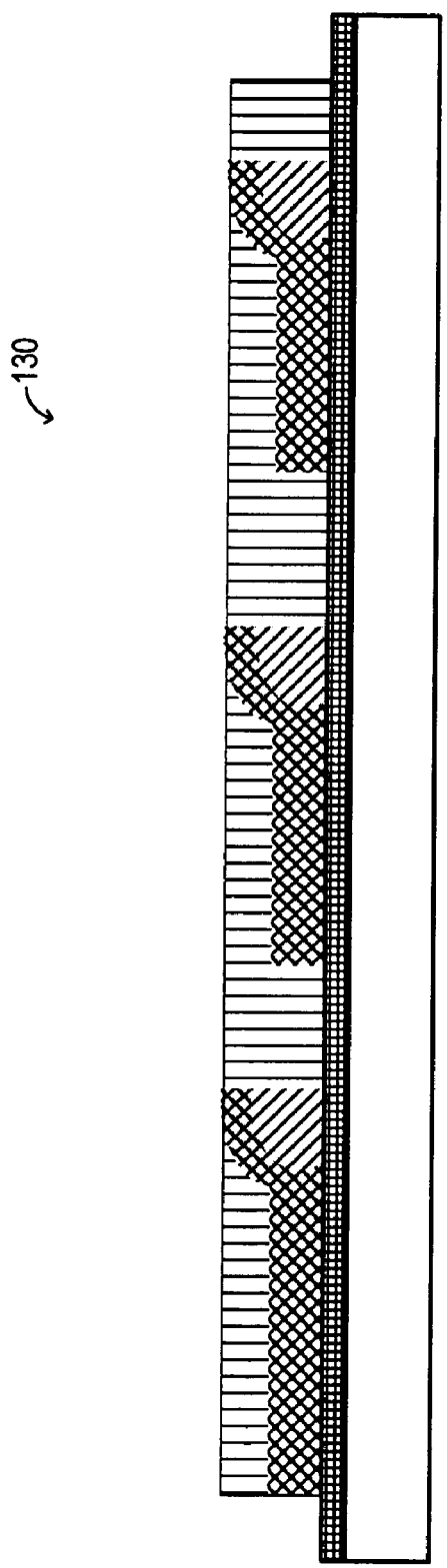
FIG. 11 is a cutaway side view of a plurality of pliant conductive elements, pliant material, second pliant material, and a carrier according to some embodiments.

Second pliant material is deposited around the plurality of pliant conductive elements at 80. FIG. 11 shows second structure 120 including second pliant material 130. Second pliant material 130 may be deposited at 75 by spraying a low viscosity material onto pliant conductive elements 15 and curing the material, by pressing a film of second pliant material 130 on conductive elements 15, or by any other method. Second pliant material 130 may comprise any pliant material, may provide dielectric properties, and/or may be identical to the material of first pliant material 20.

Figure 12:
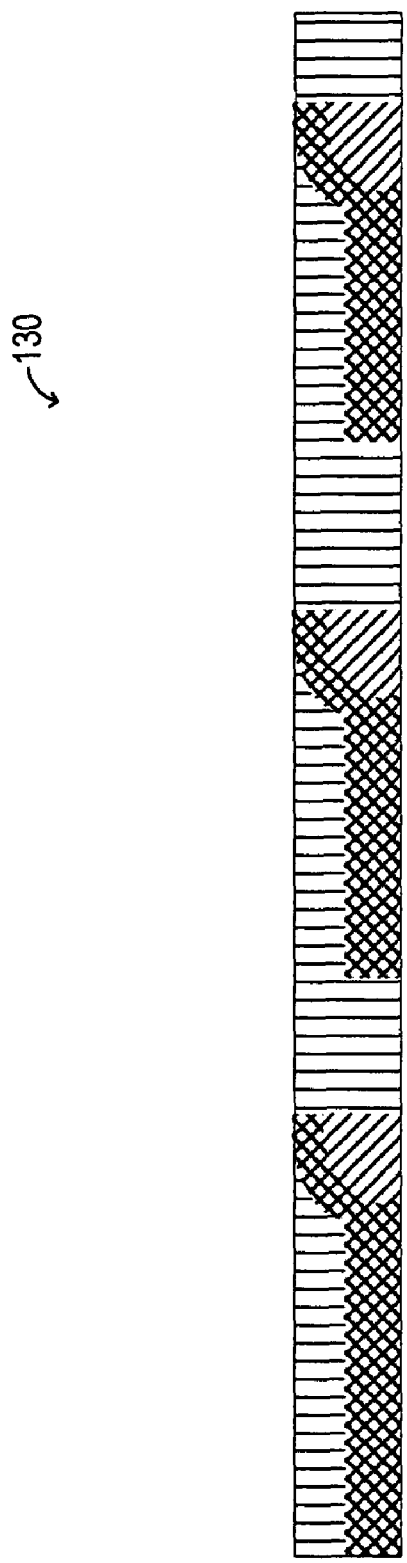
FIG. 12 is a cutaway side view of an apparatus according to some embodiments.

Structure 130 is removed from carrier 100 at 76. In some embodiments, adhesive forces between release layer 105 and structure 130 may be lessened at 76 by subjecting release layer 105 to a solvent and/or to UV light. FIG. 12 illustrates second structure 130 after 76. Second structure 130 is similar to apparatus 10 described above.

At 77, a first end of a conductive element of second structure 130 is bonded to an electrical contact of an IC substrate and a second end of the conductive element is bonded to an electrical contact of an IC die. With reference to the arrangement shown in FIG. 3, second structure 130 may be placed on IC substrate 50 and electrical contacts 15 may be pressed onto corresponding ones of electrical contacts 55 at an elevated temperature to create a bond therebetween. Also, IC die 40 may be placed on second structure 130 and solder balls 45 may be reflowed to create a bond between solder balls 45 and respective ones of electrical contacts 16. Such bonding may provide an electrical connection between the electrical contacts of IC die 40 and the electrical contacts of IC substrate 50, and may also reduce mechanical stress experienced by IC substrate 50 and IC die 40.

According to some embodiments, many pliant conductive elements exist on carrier 100 after 75. These elements may be singulated along with associated portions of first pliant material and second pliant material to create many instances of apparatus 10 as described above. Each instance may be removed from the carrier at 76 and bonded to a respective IC die and IC substrate at 77.

Figure 13:
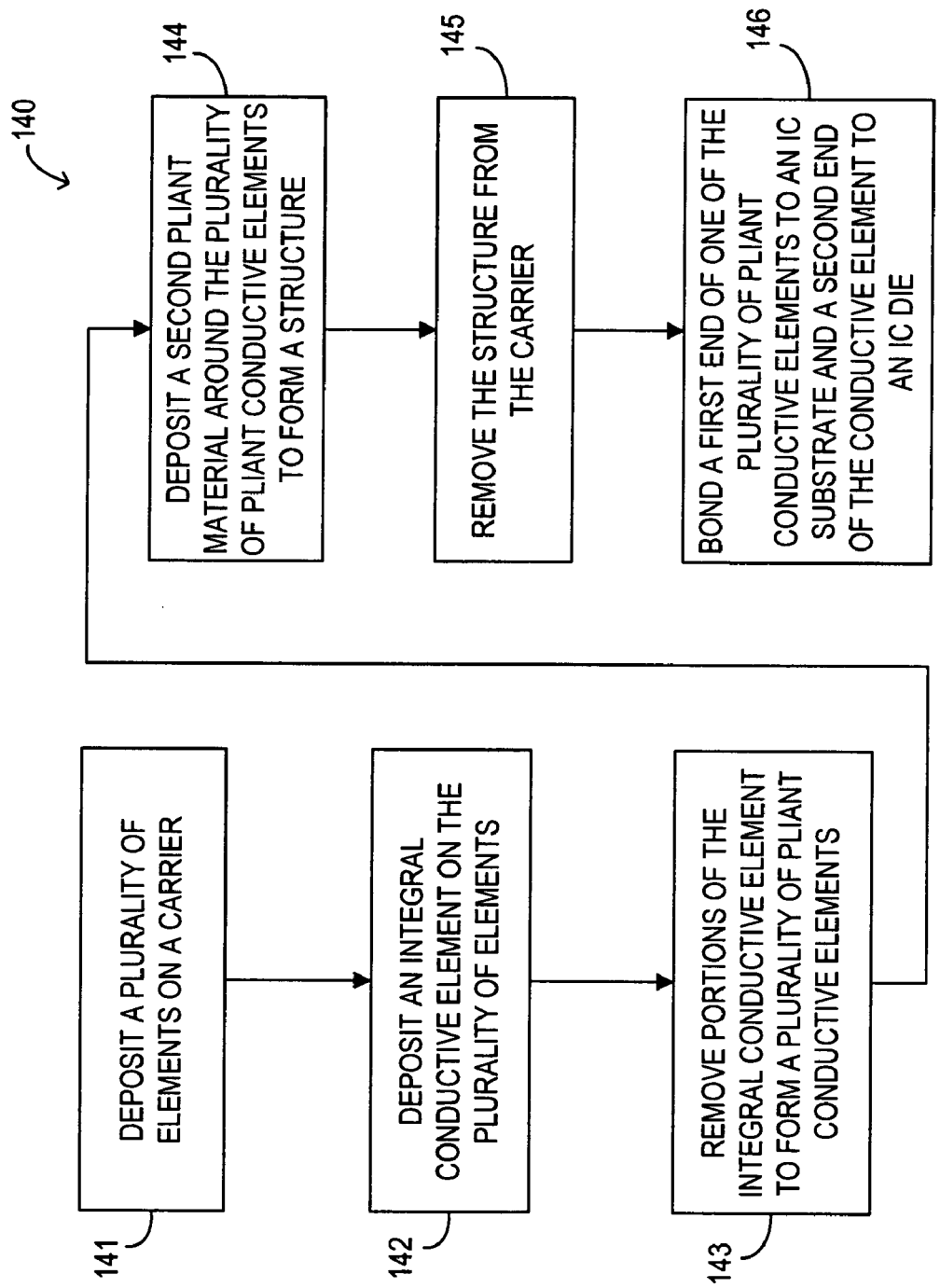
FIG. 13 is a diagram of a process to fabricate the FIG. 3 device according to some embodiments.

FIG. 13 is a diagram of process 140 according to some embodiments. Process 140 may be executed by one or more fabrication devices, and all or a part of process 140 may be executed manually. Process 140 may also be executed by an entity different from an entity that manufactures IC die 40 and/or IC substrate 50.

Figure 14:
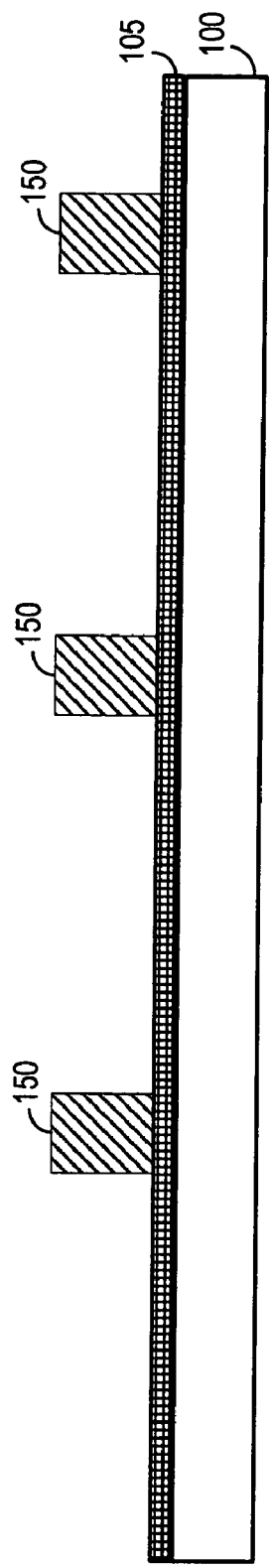
FIG. 14 is a side view of a carrier and pliant elements according to some embodiments.

A plurality of elements is deposited on a carrier at 141. The elements may comprise any material that is or can be transformed into a pliant material. The elements may be deposited by picking and placing the elements on the carrier, by layer deposition, masking and etching, or by any other method. FIG. 14 illustrates carrier 100 and pliant elements 150 after some embodiments of 141. As shown, release layer 105 was deposited on carrier 100 prior to depositing elements 150 on carrier 100.

Figure 15:
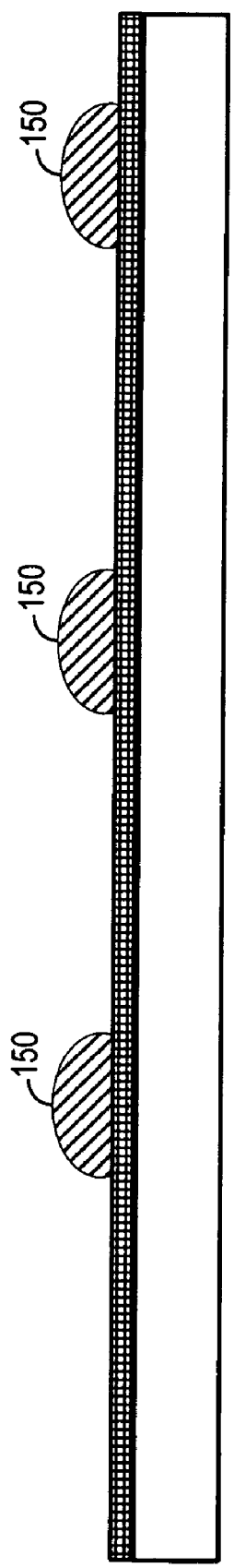
FIG. 15 is a side view of a carrier and pliant elements according to some embodiments.

FIG. 15 illustrates pliant elements 150 after energy is applied thereto at 141. The energy, which may comprise heat energy from a reflow oven, melts elements 150 into the shape illustrated in FIG. 15. The energy may also serve to change the stiffness, density, and/or dielectric properties of elements 150. In some embodiments, elements 150 are placed on carrier 100 at 71 in the form shown in FIG. 15.

Figure 16:
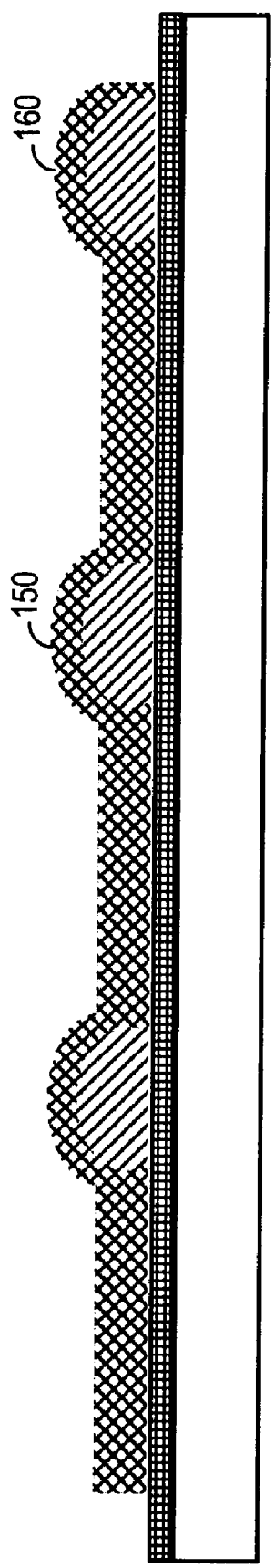
FIG. 16 is a side view of an integral conductive element, pliant elements, and a carrier according to some embodiments.

An integral conductive element is deposited on the plurality of elements at 142. FIG. 16 shows integral conductive element 160 deposited on elements 150 after 142. Integral conductive element 160 may consist of any suitable material and may be deposited in any manner according to some embodiments. In one example, element 160 is composed of copper, is press-formed onto a mold, and is pressed onto elements 150. Element 160 may also be sprayed, poured, dispensed, and/or otherwise deposited on elements 150.

Figure 17:
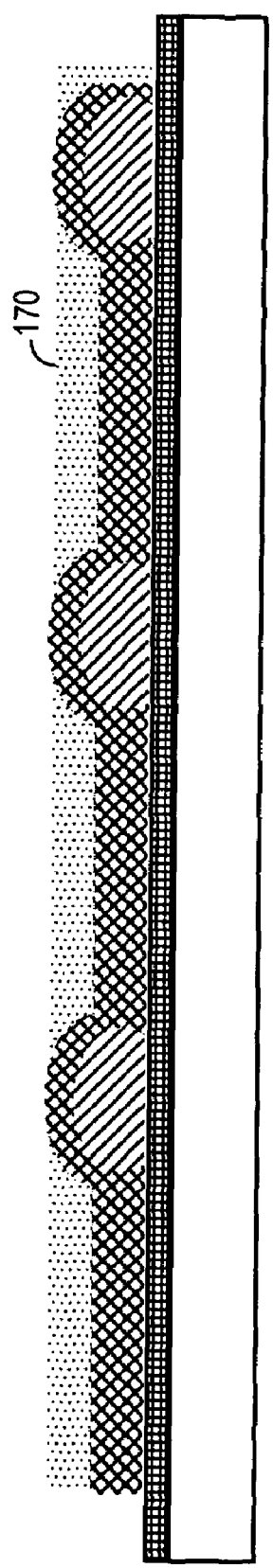
FIG. 17 is a side view of an integral conductive element, pliant elements, a carrier, and photoresist according to some embodiments.
Figure 18:
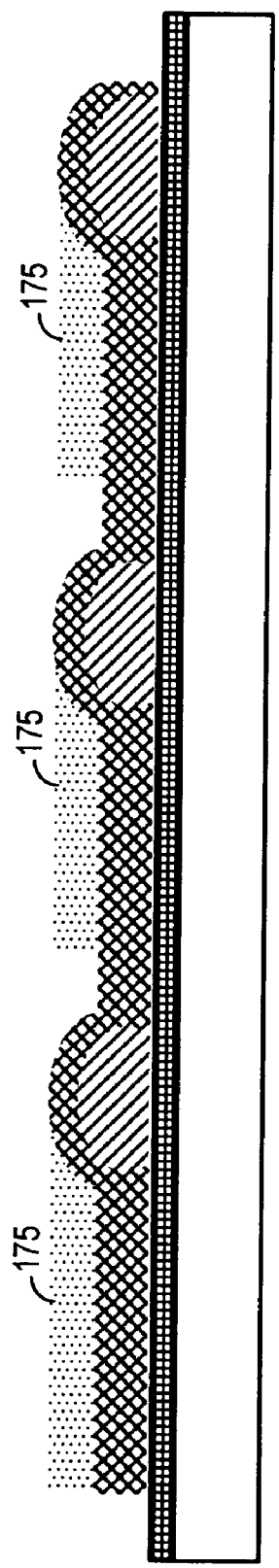
FIG. 18 is a side view of an integral conductive element, pliant elements, a carrier, and photoresist according to some embodiments.

Portions of the integral conductive element are removed at 143 to form a plurality of pliant conductive elements. Any currently- or hereafter-known method may be used to remove the portions. As illustrated in FIG. 17, photoresist 170 may initially be deposited on elements 150. Photoresist 170 may then be selectively removed using any suitable technique such as masking, UV exposure and stripping. One example of a resulting structure is illustrated in FIG. 18. The structure may then be etched to remove elements that are not protected by the remaining portions of photoresist 175, and photoresist 175 may then be removed.

Figure 19:
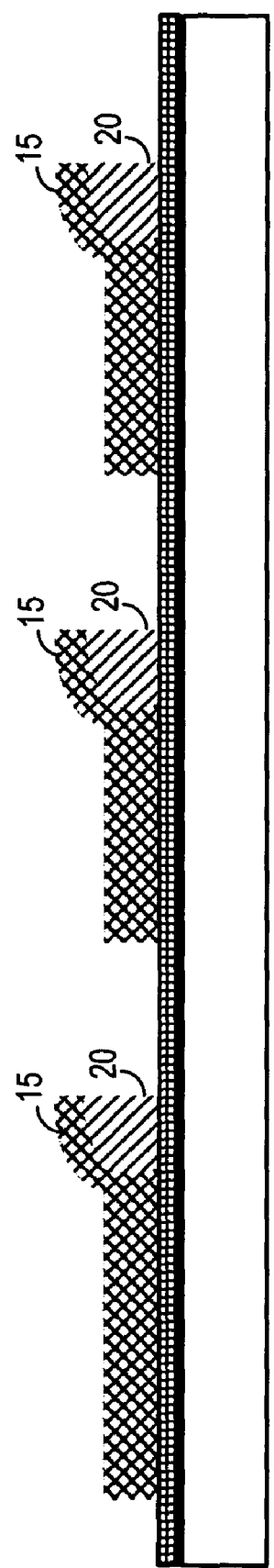
FIG. 19 is a side view of a plurality of pliant conductive elements, pliant elements, and a carrier according to some embodiments.

FIG. 19 illustrates a plurality of compliant conductive elements 15 that are formed by the removal of the portions from integral conductive element 160. As shown, portions of elements 150 have also been removed to form first pliant material 20 of FIG. 1.

Figure 20:
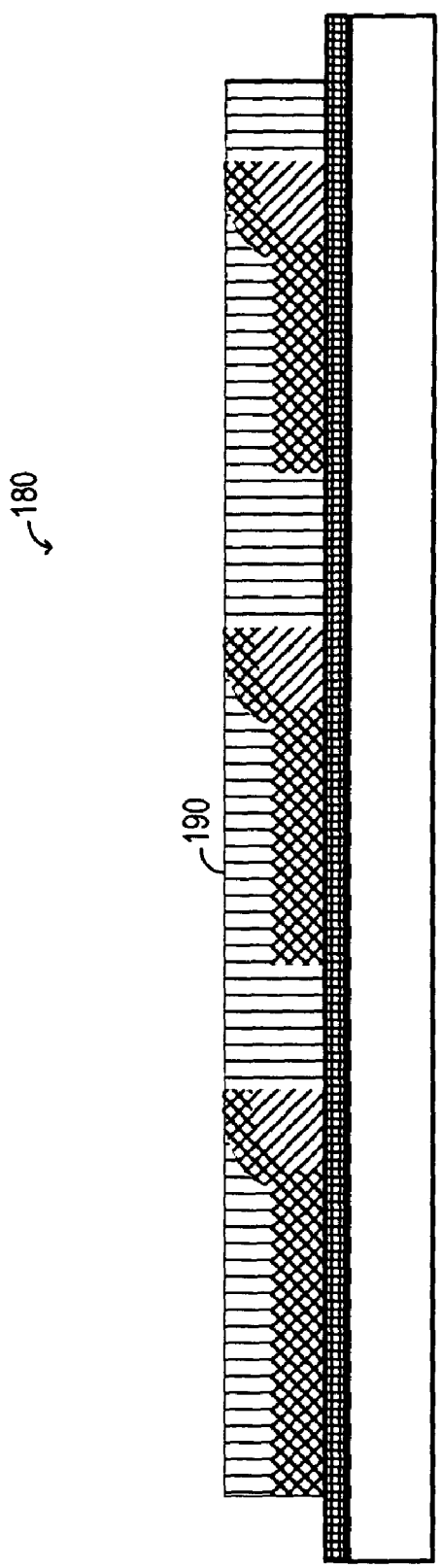
FIG. 20 is a cutaway side view of a plurality of pliant conductive elements, pliant elements, second pliant material, and a carrier according to some embodiments.

Second pliant material is deposited around the plurality of pliant conductive elements at 144. FIG. 20 shows structure 180 including second pliant material 190. Second pliant material 190 may be deposited at 143 in any manner, including but not limited to spraying a low viscosity material onto pliant conductive elements 15 and curing the material, and pressing a film of second pliant material 190 on conductive elements 15. Second pliant material 190 may comprise any pliant material, may provide dielectric properties, and/or may be identical to the material of first pliant material 20.

Structure 180 is removed from carrier 100 at 145. In some embodiments of 145, adhesive forces between release layer 105 and structure 130 may be reduced by subjecting release layer 105 to a solvent and/or to UV light. Structure 180 may be similar to structure 130 of FIG. 12 after 145.

Next, at 146, a first end of a conductive element of structure 180 is bonded to an electrical contact of an IC substrate and a second end of the conductive element is bonded to an electrical contact of an IC die. As described with respect to second structure 130, structure 180 may be placed on IC substrate 50 and electrical contacts 15 may be pressed onto corresponding ones of electrical contacts 55 at an elevated temperature to create a bond therebetween. IC die 40 may also be placed on structure 180 and solder balls 45 may be reflowed to create a bond between solder balls 45 and respective ones of electrical contacts 16. Such bonding may provide an electrical connection between the electrical contacts of IC die 40 and the electrical contacts of IC substrate 50, and may also reduce mechanical stress experienced by IC substrate 50 and IC die 40.

Nany pliant conductive elements exist on carrier 100 after 144 according to some embodiments. These elements may be singulated along with associated portions of first pliant elements and second pliant material to create many instances of apparatus 10 as described above. Each instance may be removed from the carrier at 145 and bonded to a respective IC die and IC substrate at 146.

Figure 21:
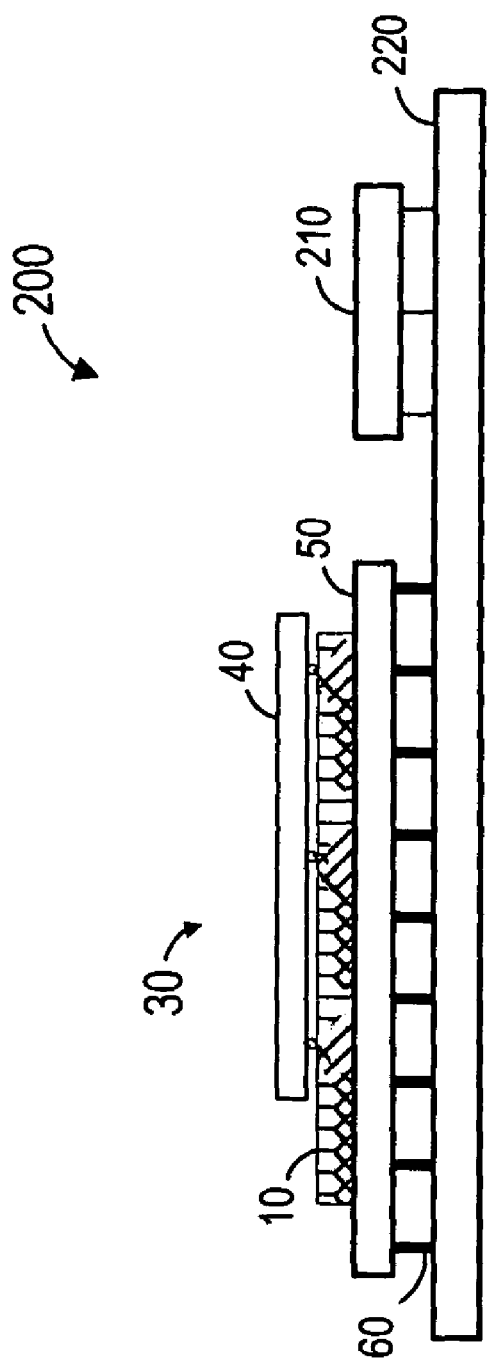
FIG. 21 is a diagram of a system according to some embodiments.

FIG. 21 is a side elevation of system 200 according to some embodiments. System 200 may comprise components of a server platform. System 200 includes device 30 as described above, memory 210 and motherboard 220. Device 30 of system 200 may comprise a microprocessor.

Motherboard 220 may electrically couple memory 210 to device 30. More particularly, motherboard 220 may comprise a memory bus (not shown) that is electrically coupled to pins 60 and to memory 210. Memory 210 may comprise any type of memory for storing data, such as a Single Data Rate Random Access Memory, a Double Data Rate Random Access Memory, or a Programmable Read Only Memory.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. A device comprising:
    an integrated circuit die comprising a first plurality of electrical contacts;
    an integrated circuit substrate comprising a second plurality of electrical contacts; and
    an interconnect patch comprising a plurality of pliant conductive elements, a first end of one of the plurality of pliant conductive elements in physical contact with one of the first plurality of electrical contacts and a second end of the one of the plurality of pliant conductive elements in physical contact with one of the second plurality of electrical contacts.

2. A device according to claim 1, wherein a first end of a second one of the plurality of pliant conductive elements is in physical contact with a second one of the first plurality of electrical contacts and a second end of the second one of the plurality of pliant conductive elements is in physical contact with the second one of the second plurality of electrical contacts.

3. A system comprising:
    a microprocessor comprising:
    an integrated circuit die comprising a first plurality of electrical contacts;
    an integrated circuit substrate comprising a second plurality of electrical contacts; and
    an interconnect patch comprising a plurality of pliant conductive elements, a first end of one of the plurality of pliant conductive elements in physical contact with one of the first plurality of electrical contacts and a second end of the one of the plurality of pliant conductive elements in physical contact with one of the second plurality of electrical contacts; and
    a double data rate memory electrically coupled to the microprocessor.

4. A system according to claim 3, wherein a first end of a second one of the plurality of pliant conductive elements is coupled to a second one of the first plurality of electrical contacts and a second end of the second one of the plurality of pliant conductive elements is coupled to the second one of the second plurality of electrical contacts.

* * * * *